United States Patent [19]
He

[11] Patent Number: 5,914,638
[45] Date of Patent: Jun. 22, 1999

[54] METHOD AND APPARATUS FOR ADJUSTING THE COMMON-MODE OUTPUT VOLTAGE OF A SAMPLE-AND-HOLD AMPLIFIER

[75] Inventor: Xinping He, San Jose, Calif.

[73] Assignee: OmniVision Technologies, Inc., Sunnyvale, Calif.

[21] Appl. No.: 08/870,498

[22] Filed: Jun. 6, 1997

[51] Int. Cl.$^6$ .............................. H03F 3/45; G11C 27/02
[52] U.S. Cl. .............................................. 330/258; 327/96
[58] Field of Search ................................. 330/9, 51, 253, 330/258, 311; 327/95, 96

[56] References Cited

U.S. PATENT DOCUMENTS

| 4,533,876 | 8/1985 | Haque et al. . |
| 4,533,877 | 8/1985 | Rahim . |

(List continued on next page.)

FOREIGN PATENT DOCUMENTS

| 404135305 | 5/1992 | Japan ..................................... 330/258 |

OTHER PUBLICATIONS

Tat C. Choi et al., "High–Frequency CMOS Switched–Capacitor Filters for Communications Application," *IEEE Journal of Solid–State Circuits*, vol. SC–18, No. 6, Dec. 1983, pp. 652–664.

Jonathan H. Fischer et al., "Line and Receiver Interface Circuit for High-Speed Voice–Band Modems," *IEEE Journal of Solid–State Circuits*, vol. SC–22, No. 6, Dec. 1987, pp. 982–989.

Kuo–Chiang Hsieh et al., "A Low–Noise Chopper–Stabilized Differential Switched–Capacitor Filtering Technique," *IEEE Journal of Solid–State Circuits*, vol. SC–16, No. 6, Dec. 1981, pp. 708–715.

Ping Wai Li et al., "A Ratio–Independent Algorithmic Analog–to–Digital Conversion Technique," *IEEE Journal of Solid–State Circuits*, vol. SC–19, No. 6, Dec. 1984, pp. 828–836.

(List continued on next page.)

*Primary Examiner*—Robert Pascal
*Assistant Examiner*—Patricia Nguyen
*Attorney, Agent, or Firm*—Christensen O'Connor Johnson & Kindness

[57] ABSTRACT

A fully differential sample-and-hold amplifier 60 includes a common-mode feedback circuit 100 for adjusting the common-mode input so that the common-mode output remains near a desired level. During a first switching state, the sample-and-hold amplifier samples voltages and is coupled to the feedback circuit 100 for the adjustment of the common-mode input level. During a second switching state, sample-and-hold amplifier performs its charge transfer and amplification function while the feedback circuit 100 is not coupled to the sample-and-hold amplifier. During the first switching state, the feedback circuit 100 receives as an input the common-mode voltage of the operational amplifier and outputs an amplification of the difference between the common-mode voltage and a regulating input voltage. The output of the sample-and-hold amplifier is coupled to the common-mode input of the operational amplifier. In this manner, differences between the common-mode voltage of the operational amplifier and the regulating voltage are used to adjust the common-mode input of the operational amplifier so that the common-mode output of the operational amplifier approximates the regulating voltage. The common-mode feedback circuit 100 includes a current source I1, a pair of differential input transistors M3 and M4, and a pair of load transistors M1 and M2. The gate of the input transistor M3 is coupled to the regulating voltage, while the gate of the input transistor M4 is coupled by a switching means to the output of the operational amplifier. The load transistors M1 and M2 are connected in an active load configuration. The output of the common-mode feedback circuit 100 is taken from the drain of the load transistor M1. The operational amplifier used in the sample-and-hold amplifier may be a telescopic cascode operational transconductance amplifier.

28 Claims, 5 Drawing Sheets

U.S. PATENT DOCUMENTS

| | | |
|---|---|---|
| 4,568,885 | 2/1986 | McKenzie et al. . |
| 4,574,250 | 3/1986 | Senderowicz . |
| 4,609,877 | 9/1986 | Nicollini et al. . |
| 4,656,437 | 4/1987 | Saari . |
| 4,714,895 | 12/1987 | Nicollini et al. . |
| 4,720,686 | 1/1988 | Westwick ................................ 330/258 |
| 4,904,953 | 2/1990 | McCormack . |
| 4,918,399 | 4/1990 | Devecchi et al. ................... 330/252 X |
| 4,933,644 | 6/1990 | Fattaruso et al. . |
| 5,187,448 | 2/1993 | Brooks et al. ........................... 330/258 |
| 5,239,210 | 8/1993 | Scott . |
| 5,455,539 | 10/1995 | Mazoyer et al. . |

OTHER PUBLICATIONS

Daniel Senderowicz, "CMOS Operational Amplifiers," *Design of Analog–Digital VSLI Circuits for Telecommunications and Signal Processing,* 2d ed., Jose E. Franca and Yannis Tsividis, eds., Prentice Hall, Englewood Cliffs, NJ 07632, pp. 27–51.

Adel S. Sedra et al., "Alternative Configurations for CMOS and BiCMOS OP Amps," *Microelectric Circuits,* 3rd ed., Harcourt Brace College Publishers, Orlando, FL, pp. 734–738.

METHOD AND APPARATUS FOR ADJUSTING THE COMMON-MODE OUTPUT VOLTAGE OF A SAMPLE-AND-HOLD AMPLIFIER

FIELD OF THE INVENTION

The present invention relates to fully differential sample-and-hold amplifiers in general, and in particular to a sample-and-hold amplifier with adjustable common-mode voltage.

BACKGROUND OF THE INVENTION

Figure 1:
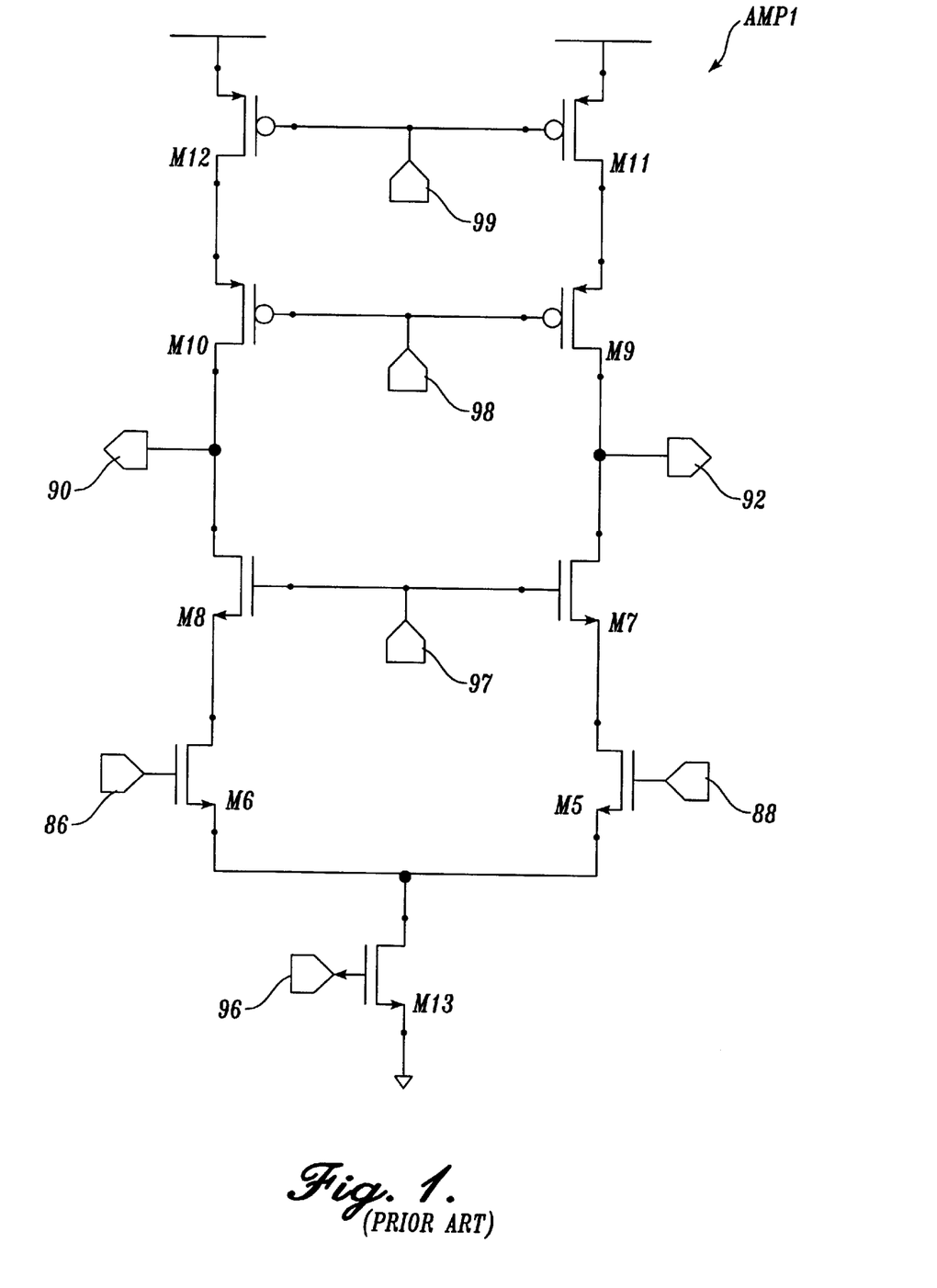
FIG. 1 is a circuit schematic of a prior art telescopic cascode operational transconductance amplifier fabricated with MOS transistors.

It is well known that the gain of an operational amplifier can be increased by adding gain stages in cascade formation. However, there are some circumstances in which this is not a practical solution; i.e., each additional gain stage increases the phase shifts and makes frequency compensation more difficult. An alternative to additional stages is to increase the gain available from existing stages. One configuration for increasing amplification in a single stage is a cascode configuration. Cascode stages increase the voltage gain of an amplifier by means of boosting its effective output impedance. FIG. 1 shows a telescopic cascode operational transconductance amplifier (OTA). Cascode amplifiers are described in *Microelectronic Circuits*, 3rd ed., Sedra & Smith, 1991, pp. 734–738, *Design of Analog-Digital BLSI Circuits for Telecommunications and Signal Processing*, 2nd ed., edited by Franka & Tsividis, 1994, pp. 27–39, and U.S. Pat. No. 4,714,895, to Nicollini et al. Some of the advantages of this type of amplifier are high bandwidth and low current requirements. As will be described below, one of the problems with this type of amplifier is that the common-mode voltage must be carefully regulated. The present invention addresses this problem.

The need to regulate the common-mode voltage of the telescopic cascode operational transconductance amplifier can be better understood by examining its method of operation. As shown in FIG. 1, the amplifier includes NMOS transistors M5, M6, M7, M8 and M13, and PMOS transistors M9, M10, M11, and M12. NMOS transistors M5 and M6 form an input differential pair which are in series with NMOS transistors M7 and M8, respectively, which are the cascode transistors. The load stage of the amplifier of FIG. 1 also has to be cascoded in order to increase its effective impedance to a level comparable with the input differential pair. Thus, the PMOS load transistors M11 and M12 are connected in series with PMOS transistors M9 and M10, respectively, which serve as the cascode load transistors. The positive input 86 and negative input 88 of the amplifier are provided at the gates of the NMOS transistors M5 and M6. The gates of NMOS transistors M7 and M8 are connected to one another and receive the bias input 97. The gates of PMOS transistors M11 and M12 are connected to one another and receive bias input 99, and the gates of PMOS transistors M9 and M10 are connected to one another and receive bias input 98. The sources of transistors M5 and M6 are connected to the drain of NMOS transistor M13, which receives the common-mode input 96 on its gate. Common-mode input 96 controls the common-mode voltage of the outputs 90 and 92 by adjusting the voltage drop across NMOS transistor M13, which shifts the relative common-mode voltage level of the amplifier.

As can be seen from the construction of the amplifier, one of the reasons why the common-mode input 96 must be carefully controlled is that either side of the amplifier has two PMOS transistors and three NMOS transistors between the power supply rails and the output 90 or 92. As described in more detail below, this number of transistors limits the maximum achievable output voltage swings of the amplifier because a certain minimum voltage drop must occur across each of the transistors, and the sum of these voltage drops determines how close the voltage swings can come to the power supply rail voltages. One of the normal techniques for compensating for the limited voltage swing in the amplifier is to bias the transistors at the very edges of their operating ranges so as to achieve the minimum voltage drop possible across the transistors. As described in U.S. Pat. No. 4,714,895, to Nicollini et al., this technique allows for the maximum output voltage swing possible. For example, with reference to FIG. 1, the bias inputs 97, 98 and 99 are preferably restricted by such limits as to allow the widest possible excursion of the output signal. By terming $V_{GS}$ the gate source voltage of the transistors of the circuit, and $V_{DSAT}$ the minimum saturation drain voltage ($V_{DSAT}=V_{GS}-V_T$, $V_T$ being the threshold voltage), these limits dictate that: bias input 99 must be a $V_{GS}$ below $V_{DD}$; bias input 98 must be a $V_{GS}+V_{DSAT}$ below $V_{DD}$; and bias input 97 must be a $V_{GS}+2V_{DSAT}$ above $V_{SS}$. Furthermore, the voltage reference for the input signal must be a $V_{GS}+V_{DSAT}$ above $V_{SS}$, while the common-mode input 96 for the common-mode feedback circuit must be a $V_{GS}$ above $V_{SS}$. With these limits on the biasing voltages, the allowable excursion range of the output signal spans from $V_{SS}+3V_{DSAT}$ on the negative to $V_{DD}-2V_{DSAT}$ on the positive. Thus, the limited range over which the output voltage swings can occur requires that the common-mode voltage be carefully controlled in the range so that the desired amplification of the input signals can be achieved.

Figure 2:
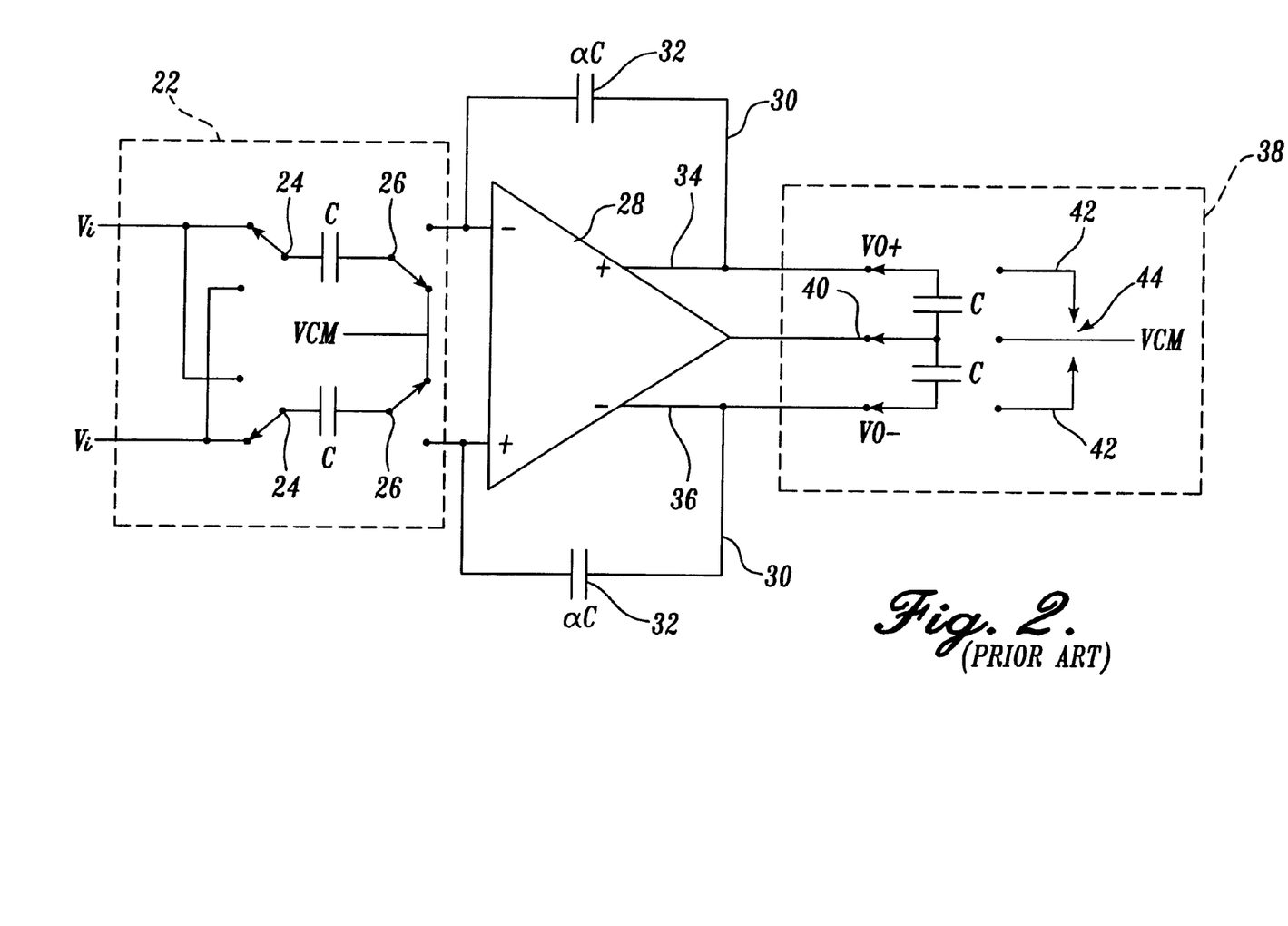
FIG. 2 is a circuit diagram of a prior art switched capacitor filter utilizing a differential input and output circuit.

One prior art method for controlling a common-mode input is disclosed in U.S. Pat. No. 4,574,250 to Senderowicz, titled "Switched Capacitor Filter Utilizing a Differential Input and Output Circuit and Method." FIG. 2 in this application corresponds to FIG. 1 in that patent. Other somewhat similar prior art circuits are shown and described in *Design of Analog-Digital BLSI Circuits for Telecommunications and Signal Processing*, supra, pp. 30–31. In the Senderowicz patent, the circuit of FIG. 2 is described as having a switched capacitor input 22 with input terminals VI⁺ and VI⁻. The difference between the input voltages VI⁺ and VI⁻ is the total input voltage VI, while the average of each of these inputs is zero. A balanced switch capacitor sampler 22 is shown diagrammatically in FIG. 2 as being comprised of two capacitors having an equal capacitance and switched at the input side by a switch 24 and at the output side by a switch 26. The output switch 26 is coupled to the input of an amplifier 28 which has balanced feedback loops 30 which include a pair of capacitors 32 of equal capacitance. The capacitance of capacitor 32 is ratioed to the capacitance of switched sampler 22. The output of operational amplifier 28 is comprised of a positive voltage output 34, VO⁺, and a negative voltage output 36, VO⁻. Outputs 34 and 36 are similarly coupled to a switch capacitor sampler 38 which serves as a common-mode feedback, again shown diagrammatically as two equal capacitances switched between the outputs 34 and 36, a center input 40, and grounded terminals 42 and a center terminal 44. The result of sampler 38 is to keep the average value of the two outputs 34 and 36 equal to zero without affecting the output voltage VO, which is equal to VO⁺–VO⁻.

Thus, in FIG. 2, the common-mode input signal 40 is derived from an average of the two output signals VO⁺ and VO⁻. The technique of taking the common-mode input signal from a division of the two output signals across a set of capacitors is commonly used in switched capacitor or sample-and-hold amplifier circuits. A similar configuration is described in U.S. Pat. No. 4,714,895, to Nicollini et al., which has the two-capacitor feedback circuit implemented specifically with a telescopic cascode operational transconductance amplifier configuration and which uses two permanent feedback capacitors in addition to the two switchable ones. However, while these techniques do allow the common-mode input to be derived from the average of the two outputs, they do not allow the common-mode output voltage to be regulated at a specific level with the precision that is required for some applications.

The present invention is directed to providing an amplifier configuration for overcoming the foregoing and other disadvantages. More specifically, the present invention is directed to an amplifier which allows precise control of the common-mode output voltage at a specific level as is required for some applications.

SUMMARY OF THE INVENTION

A fully differential sample-and-hold amplifier with common-mode feedback is disclosed. The sample-and-hold amplifier includes an operational amplifier and a common-mode feedback circuit. The operational amplifier has positive and negative inputs, two outputs, and a common-mode input for adjusting the common-mode output voltage level. The common-mode feedback circuit uses the difference between the common-mode output voltage and a regulating voltage to adjust voltage at the common-mode input so that the common-mode output voltage is made to be approximately equal to the regulating voltage.

In accordance with one aspect of the invention, the common-mode feedback circuit is constructed of two power supply rails, a current source, a regulating input, two input transistors of one channel polarity, and two load transistors of an opposite channel polarity. The current source is connected between one of the power supply rails and the sources of the two input transistors. The gate of one input transistor is connected to an output of the operational amplifier, and the gate of the other input transistor is connected to the regulating voltage. The drains of each of the input transistors are connected to a respective drain of one of the load transistors. The load transistors are connected in active load configuration with the gates connected to the drains. The output for the common-mode feedback circuit is taken from the drain of one of the load transistors and is connected to the common-mode input for the operational amplifier. This load transistor and the common-mode input transistor in the operational amplifier form a pair of current mirrors. The two load transistors are of the same channel polarity as the common-mode input transistor of the operational amplifier. This circuit has the advantages of few transistors and low current requirements.

In accordance with another aspect of the invention, the common-mode feedback circuit is operated in two switching states. During a first switching state, the inputs of the operational amplifier are connected to a reference voltage and the outputs of the operational amplifier are connected to one another so that the voltage on the outputs is the common-mode voltage of the amplifier. During this state, the sampling and integrating capacitors sample voltages on the input lines for the sample-and-hold amplifier. Also during this state, the common-mode feedback circuit is coupled to the operational amplifier so that the common-mode voltage level is adjusted to be approximately equal to the regulating voltage. During a second switching state, the sampling and integrating capacitors are connected to the operational amplifier so that it performs its charge amplification and integrating function. Operating the circuit in this manner allows the common-mode voltage of the operational amplifier to be controlled at approximately the same level as the selected regulating voltage.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 3:
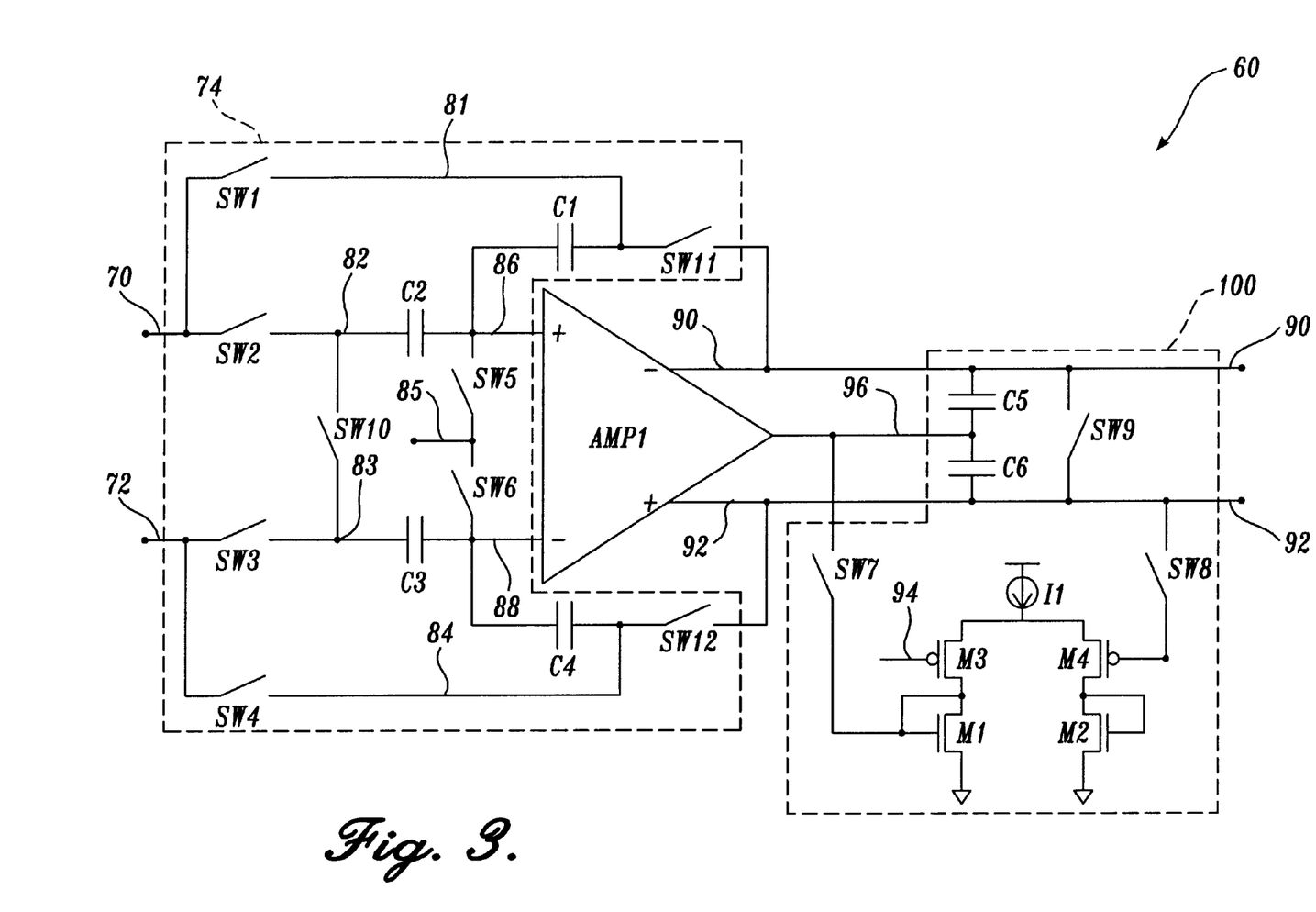
FIG. 3 is a circuit diagram of the fully differential sample-and-hold amplifier with common-mode feedback of the present invention.

A preferred construction of a sample-and-hold amplifier with adjustable common-mode voltage of the present invention is shown in FIG. 3. As will be described in more detail below, the amplifier samples voltages at the inputs 70 and 72 and amplifies them at a gain of 1+C2/C1 and 1+C3/C4 at the outputs 90 and 92. If the common-mode voltage at the outputs begins to vary from a desired level, the feedback circuit 100 operates to adjust the circuit so that the desired common-mode voltage is restored.

The sample-and-hold amplifier of FIG. 3 samples voltages at the inputs 70 and 72 through use of a sampling circuit 74. Sampling circuit 74 includes switches SW1 to SW6 and SW10 to SW12, capacitors C1 to C4, wires 81 to 84, and a reference input 85. In sampling circuit 74, the input line 70 is connected to the wire 81 by the switch SW1, and is also connected to the wire 82 by the switch SW2. The input line 72 is connected to the wire 83 by the switch SW3, and is also connected to the wire 84 by the switch SW4. The capacitor C1 is connected between the wire 81 and a positive input 86 of an operational amplifier AMP1, and the capacitor C2 is connected between the wire 82 and the positive input 86 of operational amplifier AMP1. The capacitor C3 is connected between the wire 83 and a negative input 88 of the operational amplifier AMP1, and the capacitor C4 is connected between the wire 84 and the negative input 88. The switch SW5 connects the positive input 86 of the operational amplifier AMP1 to a reference input 85, and the switch SW6 connects the negative input 88 of the operational amplifier AMP1 to the reference input 85. The switch SW10 connects the wire 82 to the wire 83. The switch SW11 connects the wire 81 to the negative output 90 of the operational amplifier AMP1, and the switch SW12 connects the wire 84 to the positive output 92 of the operational amplifier AMP1.

Figure 4:
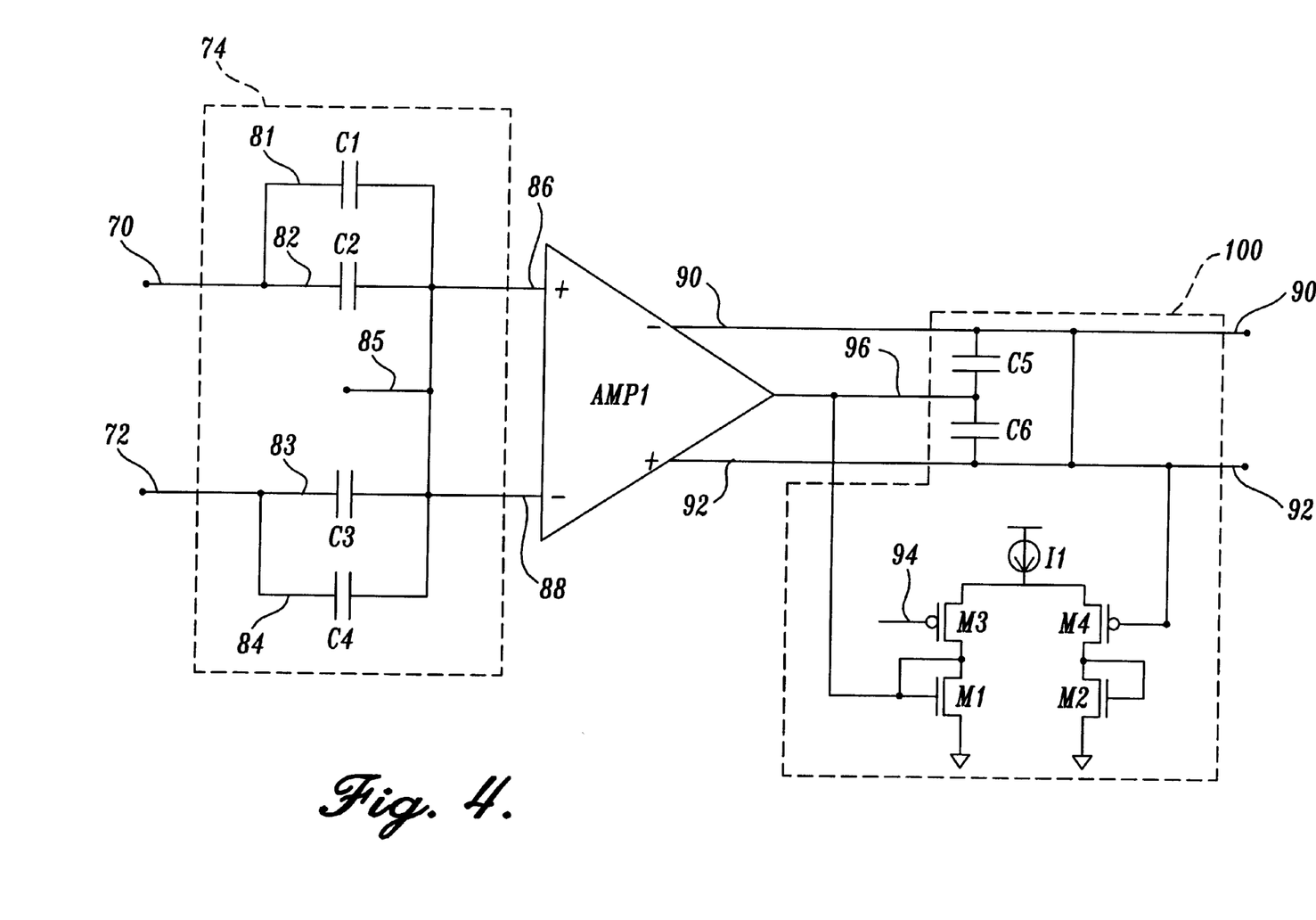
FIG. 4 is a circuit schematic of the sample-and-hold amplifier of FIG. 3 in a first switching state.

The operation of the sampling circuit 74 can be described as follows. During a first switching state, switches SW1 to SW6 are closed and switches SW10 to SW12 are left open. The switches are made conducting when they are closed and are nonconducting when they are open. The resulting configuration is shown in FIG. 4. As shown in FIG. 4, in the sampling circuit 74, input line 70 is connected directly to wires 81 and 82, and input line 72 is connected directly to wires 83 and 84. The positive and negative inputs 86 and 88 are each connected to the reference input 85. Capacitors C1 and C2 are thus connected in parallel between input line 70 and the reference input 85. Capacitors C3 and C4 are connected in parallel between input line 72 and the reference input 85.

When the sampling circuit 74 is in the state shown in FIG. 4, voltages on the input lines 70 and 72 charge the capacitors C1 to C4 relative to the voltage on the reference input 85. After this process, switches SW1 to SW6 open, thus isolating the capacitors C1 to C4 from the input lines 70 and 72 and the reference input 85. The voltages are thus stored on the capacitors and the sampling process is complete.

Figure 5:
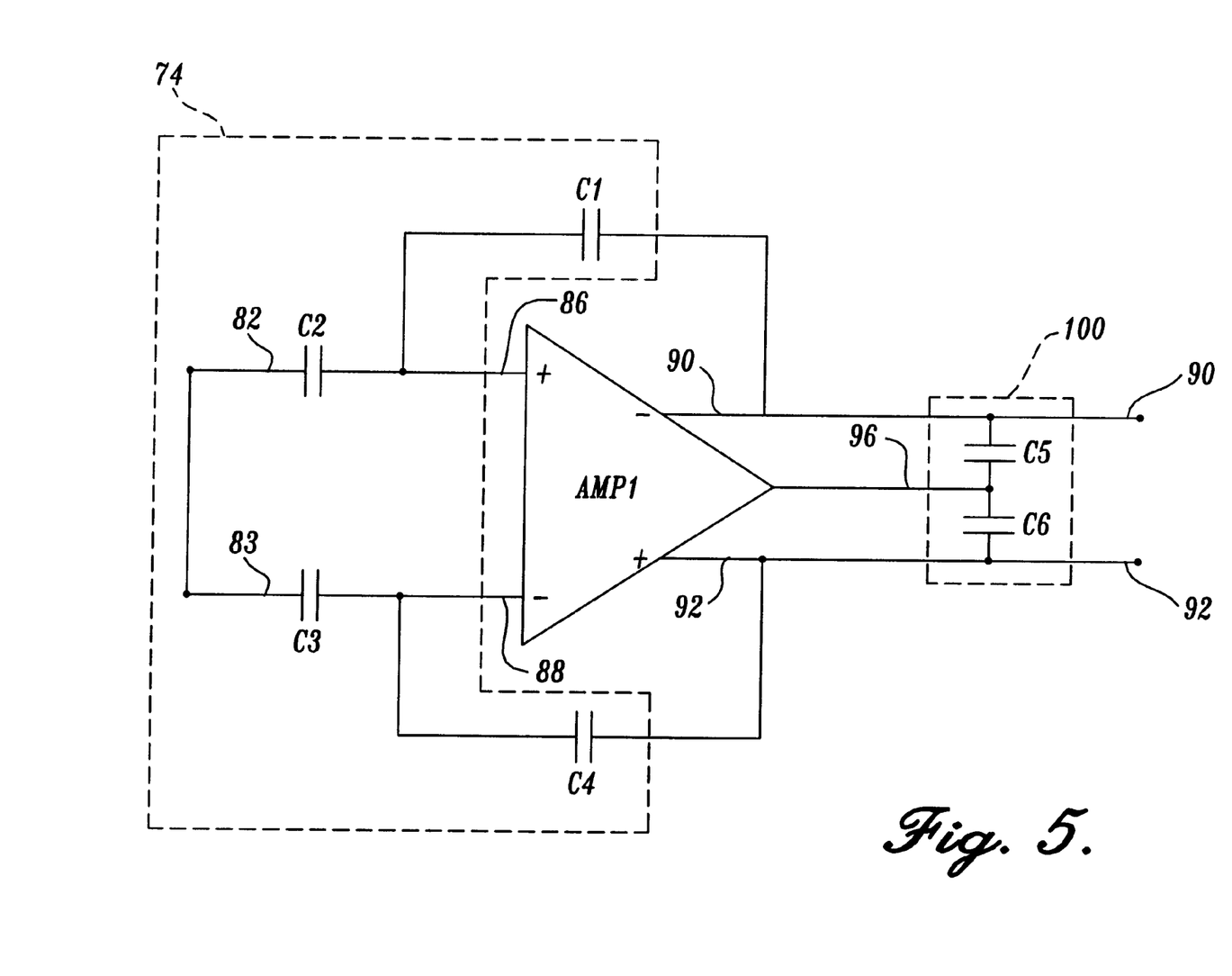
FIG. 5 is a circuit schematic of the sample-and-hold amplifier of FIG. 3 in a second switching state.

The amplification of the charges stored by the sampling circuit 74 is accomplished by the use of the capacitors C1 to C4 as inputs and feed forwards for the operational amplifier AMP1. For purposes of illustration, the operational amplifier AMP1 will be assumed to be the prior art telescopic cascode operational transconductance amplifier of FIG. 1. After the sampling process for the sampling circuit 74 is complete, during a second switching state the switches SW1 to SW6 are opened and the switches SW10 to SW12 are closed. The resulting configuration is shown in FIG. 5. As shown in FIG. 5, wire 82 is connected directly to wire 83. Capacitors C2 and C3 are thus connected in series between the positive input 86 and the negative input 88 of the operational amplifier AMP1. Capacitors C2 and C3 are thus being used as sampling capacitors for transferring the sampled charges to the inputs of operational amplifier AMP1. In addition, capacitor C1 is connected between the positive input 86 and the negative output 90 of operational amplifier AMP1, while the capacitor C4 is connected between the negative input 88 and the positive output 92 of operational amplifier AMP1. Capacitors C1 and C4 are thus being used as integrating capacitors for the operational amplifier AMP1.

The voltages on the outputs 90 and 92 during the second switching state shown in FIG. 5 thus consists of two parts. The first part results from the feed forward effect of the integrating capacitors C1 and C4. The second part results from the charge transfer between the sampling capacitors C2 and C3 and the integrating capacitors C1 and C4.

Returning to FIG. 3, the sample-and-hold amplifier of the present invention includes a feedback circuit 100 for adjusting the common-mode voltage at the outputs 90 and 92. Feedback circuit 100 senses the common-mode level at the outputs 90 and 92 and, as described in more detail below, adjusts the common-mode level toward a desired setting. As shown in FIG. 3, a switch SW7 connects feedback circuit 100 to a common-mode input 96 of amplifier AMP1. The common-mode input 96 of amplifier AMP1 is shown in FIG. 1 as being connected to the gate of transistor M13. Returning to FIG. 3, a switch SW8 connects positive output 92 to the feedback circuit 100. Feedback circuit 100 consists of switches SW7, SW8, and SW9, NMOS transistors M1 and M2, PMOS transistors M3 and M4, a current source I1, capacitors C5 and C6, and a regulating input 94. The sources of PMOS transistors M3 and M4 are connected together and receive current from the current source I1. The drains of PMOS transistors M3 and M4 are connected to the drains of NMOS transistors M1 and M2, respectively. The gates and drains of NMOS transistors M1 and M2 are connected together, respectively. The sources of NMOS transistors M1 and M2 are connected to the lower power supply rail. Switch SW8 connects the positive output 92 of amplifier AMP1 to the gate of PMOS transistor M4. Switch SW7 connects the common-mode input 96 to the gate of NMOS transistor M1. The regulating input 94 is connected to the gate of PMOS transistor M3. Switch SW9 connects the negative output 90 of amplifier AMP1 to the positive output 92. The capacitor C5 is connected between the negative output 90 of amplifier AMP1 and the common-mode input 96. The capacitor C6 is connected between the positive output 92 of amplifier AMP1 and the common-mode input 96.

The PMOS transistors M3 and M4, NMOS transistors M1 and M2, and current source I1 form a type of amplifier. In this feedback amplifier circuit the PMOS transistors M3 and M4 serve as the differential input pair and the NMOS transistors M1 and M2 are connected in an active load configuration. The outputs of this operational amplifier are at the drains of the PMOS transistors M3 and M4 which are connected to the drains of the NMOS transistors M1 and M2.

The operation of the feedback circuit 100 can be described as follows. During a first switching state, switches SW7 to SW9 are closed. The resulting configuration is shown in FIG. 4. As shown in FIG. 4, outputs 90 and 92 are connected together and are also connected to the gate of PMOS transistor M4. Common-mode input 96 is connected to the gate of NMOS transistor M1. In addition, as described earlier with reference to FIG. 4, the inputs 86 and 88 of the operational amplifier AMP1 are connected to the reference input 85 through the closing of switches SW5 and SW6.

When the feedback circuit 100 is in the state shown in FIG. 4, the two inputs 86 and 88 of the operational amplifier AMP1 both receive the same voltage on reference input 85. Similarly, both of the outputs 90 and 92 of the operational amplifier AMP1 are connected to one another and so are at the same voltage as one another. The voltage at the outputs 90 and 92 is therefore the common-mode voltage of the operational amplifier AMP1.

The common-mode voltage on outputs 90 and 92 is coupled directly to the gate of PMOS transistor M4. The voltage on the gate of PMOS transistor M3 is set by the regulating input 94. When the voltage on the gate of PMOS transistor M3 is the same as the voltage on the gate of the PMOS transistor M4 (i.e., when the common-mode voltage of amplifier AMP1 is the same as the regulating voltage 94), the current source I1 has its current equally divided down the two branches of the amplifier. This causes the output voltages at the drains of the PMOS transistors M3 and M4 to be nearly the same.

Any differences in the voltages on the gates of transistors M3 and M4 will be amplified at the outputs at the drains of the transistors M3 and M4 in the following manner. If one of the voltages on the gates of the PMOS transistors M3 or M4 becomes higher than the other, the current from the current source I1 will no longer be equally divided down the two branches. This causes the output voltage at the drain of the transistor to rise in the branch that receives more current and to lower in the branch that receives less current. Given the constant nature of the regulating input 94, any raising or lowering of the common-mode output voltage on outputs 90 and 92 with respect to the regulating input 94 will be amplified at the drain of the transistor M3.

As shown in FIG. 4, the amplified voltage at the drain of PMOS transistor M3 is applied to the common-mode input 96 of the operational amplifier AMP1. As described earlier, the drain of transistor M3 is connected to the drain and gate of transistor M1. As shown in FIG. 1, the common-mode input 96 is connected to the gate of the NMOS transistor M13. Transistors M1 and M13 in FIG. 1 form a current mirror. The common-mode output voltage is very sensitive to the common-mode input voltage, and the range of common-mode input voltage is very narrow. It will be appreciated that by using a current mirror between the feedback circuit 100 and the amplifier AMP1, the common-mode input voltage can be kept in the valid range. Voltage changes at the gate of NMOS transistor M13 are amplified such that one millivolt or less of change in the common-mode input 96 can result in several volts of change in the common-mode voltage at outputs 90 and 92. Thus, as the amplified voltage at the drain of transistor M3 adjusts the common-mode input 96, the common-mode voltage of the amplifier AMP1 is also adjusted.

The way in which this process regulates the common-mode voltage at a value near the regulating input 94 can be further understood with reference to the following example.

The circuit starts with initial equilibrium operating conditions where a certain input bias 96 level will result in a certain common-mode output voltage on outputs 90 and 92. For purposes of illustration only, assume that the initial voltage on the common-mode input 96 is 1V, which results in a common-mode output voltage on outputs 90 and 92 of 2.5V. Assume also that the regulating input 94 is at 2.5V, which is the same as the common-mode voltage on outputs 90 and 92, and which results in a 1V output at the drain of transistor M3, thus allowing the entire system to be in an equilibrium state. At some point, the operating condition of the operational amplifier AMP1 changes due to temperature variations or other operating parameters, such that the 1V bias voltage on common-mode input 96 now results in a common-mode output voltage of 5V on outputs 90 and 92. We assume that to now adjust the common-mode output voltage at outputs 90 and 92 back to the desired 2.5V level requires adjusting the voltage on the common-mode input 96 to 1.2V. Note that the 1V to 1.2V change resulting in a 5V to 2.5V output change implies an amplification of −2.5V/0.2V or −12.5 by the internal operation of amplifier AMP1.

The original 1 volt on the common-mode input 96 will cause the common-mode output signal on outputs 90 and 92 to begin rising toward the new 5 volt level. However, as the common-mode output voltage on outputs 90 and 92 begins rising from the 2.5 volt level, its change will be amplified through feedback circuit 100 and fed back into the common-mode input 96, which further amplifies the changes at outputs 90 and 92. For purposes of illustration only, assuming that the amplification of common-mode feedback circuit 100 is about 0.5, then as the common-mode output voltage on outputs 90 and 92 moves from its 2.5V level towards its 5V level, it would in fact only need to reach a 2.502 voltage level before the 0.5 times amplification of the difference from the 2.500V at regulating input 94 would cause the voltage on the common-mode input 96 to be raised from 1.0V to 1.001V. In this sequence the feedback circuit 100 has used a nearly negligible change in the common-mode output voltage on outputs 90 and 92 to adjust the voltage on the common-mode input 96 to the new level that is required to keep the common-mode output voltage at its new equilibrium condition. As a result, the common-mode output signal of 2.502V on outputs 90 and 92 remains approximately equal to the 2.5V regulating input 94 on the gate of PMOS transistor M3.

Also occurring during the second switching state as shown in FIG. 5 is that the common-mode input 96 is taken from an average of the output signals on outputs 90 and 92, as received through capacitors C5 and C6. This average signal causes the voltage of common-mode input 96 during the second switching state to rise and fall as the common-mode output voltage rises and falls. As in the first switching state, we assume the initial common-mode input 96 is at 1V, which results in a common-mode output voltage on outputs 90 and 92 of 2.5V. From a simple calculation we can get: the voltage on common-mode input 96=(((the sum of the voltages on outputs 90 and 92)/2)-(2.5−1))=the common mode voltage on outputs 90 and 92 −1.5V. Thus, capacitors C5 and C6 act as amplifiers with a gain of 1. In accordance with previous discussion, the common-mode output voltage will remain approximately equal to 2.5V.

While the preferred embodiment of the invention has been illustrated and described, it will be appreciated that various changes can be made therein without departing from the spirit and scope of the invention. For example, the amplifier AMP1 used in the circuit could be a different type of operational amplifier. Also, as is well known in the art, the functions of the NMOS and PMOS transistors of the entire circuit could be reversed. For example, the transistor M13 could be a PMOS transistor and placed at the top of the circuit, current source I1 could be placed at the bottom, and the inputs could be taken at transistors M11 and M12. In addition, rather than using a single switch SW8 to connect output 92 to feedback circuit 100, two switches, one to connect each output 90 and 92 individually to feedback circuit 100, could be used so as to reduce the sample-to-hold transition error. Consequently, within the scope of the appended claims, it will be appreciated that the invention can be practiced otherwise than as specifically described herein.

The embodiments of the invention in which an exclusive property or privilege is claimed are defined as follows:

1. A sample-and-hold amplifier comprising:
   a fully differential operational amplifier having two outputs, a common-mode output voltage on the two outputs, and a common-mode input for adjusting the level of the common-mode output voltage;
   a common-mode feedback circuit comprising:
      a regulating input voltage;
      a switching means for coupling the feedback circuit between one of the outputs of the operational amplifier and the common-mode input of the operational amplifier; and
      a means for amplifying the difference between the common-mode output voltage of the operational amplifier and the regulating input voltage, and applying the amplified difference to the common-mode input of the operational amplifier so that the common-mode output voltage of the operational amplifier is adjusted to where it is approximately equal to the regulating voltage; and
   the sample-and-hold amplifier having a switching cycle with at least two switching states, the switching means of the common-mode feedback circuit in a first switching state coupling the amplifying means of the common-mode feedback circuit to the common-mode input of the operational amplifier, the switching means in a second switching state decoupling the amplifying means from the common-mode input.

2. The operational amplifier of claim 1, wherein the operational amplifier is a telescopic cascode operational transconductance amplifier.

3. The sample-and-hold amplifier of claim 1, further comprising first and second power supply rails;
   wherein the operational amplifier further comprises a common-mode input transistor with a gate, a drain, a source, and a channel of a first polarity, the gate of the common-mode input transistor comprising the common-mode input of the operational amplifier, the common-mode input transistor having its source coupled to the first power supply rail; and wherein the means for amplifying the difference between the common-mode output voltage and the regulating voltage comprises a current source, a pair of input transistors with gates, drains, sources, and channels of a second polarity, a pair of load transistors with gates, drains, sources, and channels of the first polarity, the current source being coupled between the sources of the input transistors and the second power supply rail, the drains of each of the input transistors being coupled to one of each of the drains of the two load transistors, the drain of one of the load transistors being coupled to the gate of the common-mode input transistor, the sources of the load transistors being coupled to the first power supply rail, the regulating voltage being coupled to one of the gates of one of the input transistors.

4. A sample-and-hold amplifier of claim 3, wherein the switching means for coupling the feedback circuit between one of the outputs of the operational amplifier and the common-mode input of the operational amplifier comprises a switch for coupling one of the outputs of the operational amplifier to one of the gates of one of the input transistors of the common-mode feedback circuit, and a switch for coupling one of the drains of the load transistors to the gate of the common-mode input transistor of the operational amplifier.

5. The sample-and-hold amplifier of claim 4, further comprising:
   a reference voltage;
   a switching means for coupling the two inputs of the operational amplifier to the reference voltage;
   a switching means for coupling the two outputs of the operational amplifier to one another, so that when the feedback circuit is coupled to the output of the operational amplifier the voltage on the output is exclusively the common-mode output voltage.

6. A fully differential sample-and-hold amplifier, comprising:
   a fully differential operational amplifier with a positive and negative input, a first and second output, and a common-mode input for adjusting the common-mode output voltage at the first and second outputs;
   a common-mode feedback circuit comprising:
      two inputs and an output, the voltage at the output being determined by the difference between the two inputs;
      a regulating input voltage, which is set at the approximate desired level for the common-mode output voltage of the operational amplifier and which is coupled to one of the inputs of the feedback circuit;
      a first switching means for coupling the other of the inputs of the feedback circuit to the first output of the operational amplifier and for coupling the output of the feedback circuit to the common-mode input of the operational amplifier;
      the feedback circuit operating as an amplifier in that the voltage at the output is an amplified difference of the two inputs; and
   the sample-and-hold amplifier having a switching cycle with at least two switching states, the switching means of the common-mode feedback circuit in a first switching state coupling the common-mode feedback circuit to the common-mode input of the operational amplifier, the switching means in a second switching state decoupling the common-mode feedback circuit from the common-mode input.

7. The sample-and-hold amplifier of claim 6, wherein the operational amplifier is a telescopic cascode operational transconductance amplifier.

8. The sample-and-hold amplifier of claim 6, wherein the common-mode feedback circuit further comprises:
   a pair of input transistors and a pair of load transistors, each transistor having a source, a drain and a gate;
   the pair of input transistors having their sources coupled together, the sources being coupled to the current source, the gates of the input transistors comprising the inputs of the feedback circuit, the pair of load transistors having each of their drains coupled to a respective drain of each of the two input transistors, the drain of one of the load transistors comprising the output of the feedback circuit.

9. The sample-and-hold amplifier of claim 6, further comprising:
   a reference voltage;
   a second switching means for coupling the positive and negative inputs of the operational amplifier to the reference voltage; and
   a third switching means for coupling the two outputs of the operational amplifier to one another, so that when the common-mode feedback circuit is coupled to the operational amplifier, the voltage on both of the outputs of the operational amplifier is exclusively the common-mode output voltage.

10. The sample-and-hold amplifier of claim 9, further comprising:
    first and second input lines into the sample-and-hold amplifier;
    a fourth, fifth, sixth, seventh, eighth, ninth, and tenth switching means;
    first and second integrating capacitors, each having first and second sides;
    first and second sampling capacitors, each having first and second sides;
    the first integrating capacitor being coupled on its first side to the positive input of the operational amplifier and being coupled on its second side by the fourth switching means to the first input line and also being coupled on its second side by the fifth switching means to the first output of the operational amplifier;
    the second integrating capacitor being coupled on its first side to the negative input of the operational amplifier and being coupled on its second side by the sixth switching means to the second input line and also being coupled on its second side by the seventh switching means to the second output of the operational amplifier;
    the first sampling capacitor being coupled on its first side to the positive input of the operational amplifier and being coupled on its second side by the eighth switching means to the first input line;
    the second sampling capacitor being coupled on its first side to the negative input of the operational amplifier and being coupled on its second side by the ninth switching means to the second input line;
    the first and second sampling capacitors also being coupled to one another on their second sides by the tenth switching means;
    the first, second, third, fourth, sixth, eighth, and ninth switching means being closed during a first switching state and open during a second switching state; and the fifth, seventh and tenth switching means being open during the first switching state and closed during the second switching state during the operation of the sample-and-hold amplifier.

11. A fully differential sample-and-hold amplifier with common-mode feedback comprising:

first and second power supply rails;

a fully differential operational amplifier comprising positive and negative inputs, two outputs, a common-mode output voltage level on the outputs, and a common-mode input transistor with a gate, a drain, a source and a channel of a first polarity, the common-mode input transistor adjusting the common-mode output voltage level of the operational amplifier and having its source coupled to the first power supply rail;

a common-mode feedback circuit, comprising an amplifier with a current source, a regulating input voltage, a pair of input transistors with gates, drains, sources, and channels of a second polarity, a pair of load transistors with gates, drains, sources, and channels of the first polarity, the current source being coupled between the sources of the input transistors and the second power supply rail, the drains of each of the two input transistors being coupled to one of each of the drains of the two load transistors, the sources of the load transistors being coupled to the first power supply rail, the gate of one of the input transistors being coupled to the regulating input voltage;

a switching means for coupling a gate of the other input transistor of the feedback circuit to one of the outputs of the operational amplifier and for coupling the drain of one of the load transistors of the feedback circuit to the gate of the common-mode input transistor of the operational amplifier, such that the load transistor emulates the common-mode input transistor; and the sample-and-hold amplifier having a switching cycle with at least two switching states, the switching means of the common-mode feedback circuit in a first switching state coupling the amplifier of the common-mode feedback circuit to the common-mode input of the operational amplifier, the switching means in a second switching state decoupling the amplifier of the common-mode feedback circuit from the common-mode input.

12. The sample-and-hold amplifier of claim 11, wherein the drains of each of the load transistors are each coupled to their respective gates.

13. The sample-and-hold amplifier of claim 12, wherein the operational amplifier further comprises a pair of input transistors with gates, drains, sources, and channels of the first polarity, a first pair of cascoded transistors with gates, drains, sources, and channels of the first polarity, a pair of load transistors with gates, drains, sources and channels of the second polarity, and a second pair of cascoded transistors with gates, drains, sources, and channels of the second polarity, the gates of the pair of input transistors comprising the positive and negative inputs of the operational amplifier, wherein in each pair of load and cascode transistors in the operational amplifier the gates are connected together and receive a respective bias voltage, and the first pair of cascoded transistors is cascoded with the pair of input transistors, and the second pair of cascoded transistors is cascoded with the pair of load transistors, the two outputs of the operational amplifier being taken at the drains of the first pair of cascoded transistors.

14. In a sample-and-hold amplifier a method for adjusting a common-mode output voltage level, the sample-and-hold amplifier having a regulating input voltage, a fully differential operational amplifier with two inputs, two outputs, a common-mode output voltage on the two outputs, a common-mode input for adjusting the common-mode output voltage level, the sample-and-hold amplifier also having a feedback circuit with an amplifying means, the sample-and-hold amplifier having a switching cycle with at least two switching states, the amplifying means of the feedback circuit in a first switching state being coupled to the common-mode input for adjusting the common-mode input voltage, the amplifying means of the feedback circuit in a second switching state being decoupled from the common-mode input, the method operating during the first switching state to adjust the common-mode input voltage, the method comprising:

(a) amplifying any difference between the common-mode output voltage level and the regulating input voltage level;

(b) applying the amplified difference voltage to the common-mode input of the operational amplifier;

(c) continuing to adjust the common-mode input voltage by repeating steps (a) and (b) so that the common-mode output voltage is made to be approximately equal to the regulating input voltage.

15. The method of claim 14, wherein the operational amplifier is a telescopic cascode operational transconductance amplifier.

16. The method of claim 14, wherein the operational amplifier further comprises a reference voltage, the method further comprising the step of coupling the two inputs of the operational amplifier to the reference voltage, and also coupling the two outputs of the operational amplifier to one another so that the common-mode output voltage of the operational amplifier can be taken directly from either of the two outputs.

17. The method of claim 14, wherein the feedback circuit comprises two input transistors and two load transistors.

18. The method of claim 17, wherein the operational amplifier further comprises a common-mode input transistor, the gate of the common-mode input transistor comprising the common mode input of the operational amplifier, the common-mode input transistor being emulated by one of the load transistors of the feedback circuit.

19. The method of claim 14, further comprising the step of changing the regulating voltage level and repeating steps (a), (b), and (c) so as to adjust the common-mode output voltage to be approximately equal to the new regulating voltage level.

20. A sample-and-hold amplifier comprising:

a fully differential operational amplifier having two outputs, a common-mode output voltage on the two outputs, and a common-mode input for adjusting the level of the common-mode output voltage;

a common-mode feedback circuit comprising:

a regulating input voltage;

a switching means for coupling the feedback circuit between one of the outputs of the operational amplifier and the common-mode input of the operational amplifier;

a means for amplifying the difference between the common-mode output voltage of the operational amplifier and the regulating input voltage, and applying the amplified difference to the common-mode input of the operational amplifier so that the common-mode output voltage of the operational amplifier is adjusted to where it is approximately equal to the regulating voltage;

first and second power supply rails;

wherein the operational amplifier further comprises a common-mode input transistor with a gate, a drain, a source, and a channel of a first polarity, the gate of the common-mode input transistor comprising the common-mode input of the operational amplifier, the common-mode input transistor having its source coupled to the first power supply rail;

wherein the means for amplifying the difference between the common-mode output voltage and the regulating voltage comprises a current source, a pair of input transistors with gates, drains, sources, and channels of a second polarity, a pair of load transistors with gates, drains, sources, and channels of the first polarity, the current source being coupled between the sources of the input transistors and the second power supply rail, the drains of each of the input transistors being coupled to one of each of the drains of the two load transistors, the sources of the load transistors being coupled to the first power supply rail, the regulating voltage being coupled to one of the gates of one of the input transistors; and wherein the switching means for coupling the feedback circuit between one of the outputs of the operational amplifier and the common-mode input of the operational amplifier comprises a switch for coupling one of the outputs of the operational amplifier to one of the gates of one of the input transistors of the common-mode feedback circuit, and a switch for coupling one of the drains of the load transistors to the gate of the common-mode input transistor of the operational amplifier.

21. The sample-and-hold amplifier of claim 22, further comprising:

a reference voltage;

a switching means for coupling the two inputs of the operational amplifier to the reference voltage;

a switching means for coupling the two outputs of the operational amplifier to one another, so that when the feedback circuit is coupled to the output of the operational amplifier the voltage on the output is exclusively the common-mode output voltage.

22. A fully differential sample-and-hold amplifier, comprising:

a fully differential operational amplifier with a positive and negative input, a first and second output, and a common-mode input for adjusting the common-mode output voltage at the first and second outputs;

a common-mode feedback circuit comprising:

two inputs and an output, the voltage at the output being determined by the difference between the two inputs;

a regulating input voltage, which is set at the approximate desired level for the common-mode output voltage of the operational amplifier and which is coupled to one of the inputs of the feedback circuit; and a first switching means for coupling the other of the inputs of the feedback circuit to the first output of the operational amplifier and for coupling the output of the feedback circuit to the common-mode input of the operational amplifier;

a reference voltage;

a second switching means for coupling the positive and negative inputs of the operational amplifier to the reference voltage; and a third switching means for coupling the two outputs of the operational amplifier to one another, so that when the common-mode feedback circuit is coupled to the operational amplifier, the voltage on both of the outputs of the operational amplifier is exclusively the common-mode output voltage.

23. The sample-and-hold amplifier of claim 22, further comprising:

first and second input lines into the sample-and-hold amplifier;

a fourth, fifth, sixth, seventh, eighth, ninth, and tenth switching means;

first and second integrating capacitors, each having first and second sides;

first and second sampling capacitors, each having first and second sides;

the first integrating capacitor being coupled on its first side to the positive input of the operational amplifier and being coupled on its second side by the fourth switching means to the first input line and also being coupled on its second side by the fifth switching means to the first output of the operational amplifier;

the second integrating capacitor being coupled on its first side to the negative input of the operational amplifier and being coupled on its second side by the sixth switching means to the second input line and also being coupled on its second side by the seventh switching means to the second output of the operational amplifier;

the first sampling capacitor being coupled on its first side to the positive input of the operational amplifier and being coupled on its second side by the eighth switching means to the first input line;

the second sampling capacitor being coupled on its first side to the negative input of the operational amplifier and being coupled on its second side by the ninth switching means to the second input line;

the first and second sampling capacitors also being coupled to one another on their second sides by the tenth switching means;

the first, second, third, fourth, sixth, eighth, and ninth switching means being closed during a first switching state and open during a second switching state; and the fifth, seventh and tenth switching means being open during the first switching state and closed during the second switching state during the operation of the sample-and-hold amplifier.

24. In a sample-and-hold amplifier a method for adjusting a common-mode output voltage level, the sample-and-hold amplifier having a regulating input voltage, a fully differential operational amplifier with two inputs, two outputs, a common-mode output voltage on the two outputs, a common-mode input for adjusting the common-mode output voltage level, and a reference voltage, the method comprising the steps of:

(a) amplifying any difference between the common-mode output voltage level and the regulating input voltage level;

(b) applying the amplified difference voltage to the common-mode input of the operational amplifier;

(c) continuing to adjust the common-mode input voltage by repeating steps (a) and (b) so that the common-mode output voltage is made to be approximately equal to the regulating input voltage; and (d) coupling the two inputs of the operational amplifier to the reference voltage, and also coupling the two outputs of the operational amplifier to one another so that the common-mode output voltage of the operational amplifier can be taken directly from either of the two outputs.

25. The method of claim 24, wherein the sample-and-hold amplifier further comprises a feedback circuit for implementing steps (a), (b), and (c).

26. The method of claim 25, wherein the feedback circuit comprises two input transistors and two load transistors.

27. The method of claim 26, wherein the operational amplifier further comprises a common-mode input transistor, the gate of the common-mode input transistor comprising the common-mode input of the operational amplifier, the common-mode input transistor being emulated by one of the load transistors of the feedback circuit.

28. The method of claim 24, further comprising the step of changing the regulating voltage level and repeating steps (a), (b), and (c) so as to adjust the common-mode output voltage to be approximately equal to the new regulating voltage level.

* * * * *

UNITED STATES PATENT AND TRADEMARK OFFICE
CERTIFICATE OF CORRECTION

PATENT NO.   : 5,914,638
DATED        : June 22, 1999
INVENTOR(S)  : X. He

It is certified that error appears in the above-identified patent and that said Letters Patent is hereby corrected as shown below:

| COLUMN | LINE | |
|---|---|---|
| 13 | 37 | "of claim 22," should read --of claim 20,-- |
| (Claim 21, | line 1) | |

Signed and Sealed this

Thirtieth Day of November, 1999

Attest:

Attesting Officer

Q. TODD DICKINSON

Acting Commissioner of Patents and Trademarks